United States Patent [19]
Openlander

[11] Patent Number: 5,072,189
[45] Date of Patent: Dec. 10, 1991

[54] SCALAR NETWORK ANALYZER
[75] Inventor: Wayne R. Openlander, Chicago, Ill.
[73] Assignee: Direct Conversion Technique, Inc., Des Plaines, Ill.
[21] Appl. No.: 502,129
[22] Filed: Mar. 29, 1990
[51] Int. Cl.[5] ............................................ G01R 27/02
[52] U.S. Cl. .................................. 324/638; 324/646; 324/615
[58] Field of Search ............... 324/638, 639, 641, 642, 324/645, 646, 637, 629, 615; 455/315

[56] References Cited
U.S. PATENT DOCUMENTS

| | | | |
|---|---|---|---|
| 2,887,652 | 5/1959 | Bendayan et al. | 324/603 X |
| 3,031,615 | 4/1962 | Chase et al. | |
| 3,904,959 | 9/1975 | Britton, Jr. | 324/646 X |
| 4,263,653 | 4/1981 | Mecklenburg | 324/646 X |
| 4,290,009 | 9/1981 | Sanpei et al. | |
| 4,580,092 | 4/1986 | Squire | 324/646 |
| 4,680,538 | 7/1987 | Dalman et al. | 324/638 |
| 4,816,767 | 3/1989 | Cannon et al. | 324/638 X |

OTHER PUBLICATIONS
Ananasso, "A Low Phase Shift Step Attenuator Using P-L-N Diodes Switches", *IEEE Transactions*, vol. MTT-28 (Jul. 1980), pp. 774–776.
Braithwaite, "An RF Voltmeter", *Ham Radio*, (Nov. 1987), pp. 65–75.
Hayward, "Beyond the Dipper", *QST*, (May 1986), pp. 14–20.

*Primary Examiner*—Kenneth A. Wieder
*Assistant Examiner*—Robert W. Mueller
*Attorney, Agent, or Firm*—R. Winston Slater

[57] ABSTRACT

A low cost and portable scalar network analyzer for the simultaneous measurement of forward and reflected scalar scattering parameters of devices under test. Plural UHF oscillators of similar construction are mixed to produce a wideband test instrument having good stability characteristics. A dual-diode biased RF detector with feedback, including an in-loop adjustable gain buffer stage, provides enhanced linearity, over a wide dynamic range, and at low cost. The forward transfer parameter measurement arrangement further includes a selectable attenuation/gain PIN-diode switched stage to accommodate the widely varying gain/attenuation characteristics of devices under test.

6 Claims, 4 Drawing Sheets

SCALAR NETWORK ANALYZER

Background of the Invention

The present invention relates to electronic apparatus for testing passive and active radio frequency (RF) components and systems and, more specifically, to a scalar network analyzer for independently or simultaneously measuring the scalar reflection and transmission coefficients associated with such components and systems.

Network analyzers have been known for many years and, indeed, have become quite sophisticated. Modern instruments often incorporate, by way of example, wide frequency capability, high sensitivity and accuracy, and the ability to resolve reflection and transmission coefficients as vector quantities. It is, however, this very sophistication that renders such units unsuitable for many applications.

In the first instance, the above described network analyzers are notoriously expensive. They simply cannot be cost justified for many applications and uses. Such cost is in large measure attributable to the intrinsic nature of the conventional network analyzer product itself. These instruments commonly incorporate features and capabilities greatly exceeding the requirements for many design and test applications. They are, in short, over designed for many applications and budgets.

Another limitation of the conventional network analyzer is its size, weight, and power consumption. Not unexpectedly, there is an inherent tradeoff between features and complexity on one hand and size, weight, and power consumption on the other. The present network analyzer has been developed, not merely in response to the substantial need for an economical piece of RF test equipment, but to facilitate device and system testing in many field and remote locations in which the physical and power constraints preclude use of presently available RF test equipment.

For example, the present apparatus is particularly suited for on-site testing of antenna and RF transmission line installations. Such systems cannot meaningfully be removed to the laboratory for testing. But even where such relocation is technologically feasible, time and expense preclude this as a viable option.

Indeed the present analyzer may be advantageously fabricated in a portable configuration and operated from battery power thereby permitting its use in the most distant and hostile of environments, for instance, at the feed-point of an antenna system located hundreds of feet above ground level.

At the other end of the cost spectrum, there are devices suitable for measuring device or system return or transmission coefficients. For example, the ordinary power wattmeter or directional coupler has proved entirely satisfactory in many applications. The present network analyzer, however, overcomes certain limitations and deficiencies of these common instruments.

Conventional wattmeters and directional couplers, for example, are generally not self contained and typically require a separate source of RF energy, often at significant power levels. Thus, the measurement of antenna return losses, particularly for well-matched antenna systems having low return losses (e.g. in the order of −20db), are often conducted by applying full transmitter power to the antenna but, in any event, by applying power levels of tens, hundreds, or more watts.

Use of such high level measuring techniques may be detrimental to service personnel located in close proximity to the antenna (i.e. within the near field). Furthermore, the presence of significant levels of RF energy can adversely impact the performance of other electronic equipment present at the test site. And finally, use of actual transmitter, or transmitterlevel, RF power generally requires additional personnel located at the transmitter itself to activate/deactivate this source of RF energy as required during the placement, testing and removal of the in-line instrumentation.

It will be further appreciated that the use of on-site transmitter equipment in connection with the testing and/or alignment of communication system equipment (e.g. cavities, duplexers, and antennas) precludes evaluation of such system performance at all frequencies other than those actual operating frequencies for which the transmitter equipment is set-up. It is often desirable to check system performance at non-operating frequencies, for example, to verify proper alignment of the receiver "notch" or "suck-out" in a transmitter filter or duplexer cavity.

Another aspect of the present network analyzer not known in competing technologies is the ability to monitor and measure the input reflection coefficient and the output or transmission coefficient (commonly referred to as scalar scattering parameters) and to do so, simultaneously. This is particularly advantageous in the development or testing of passive or active amplifiers, filters and similar devices.

U.S. Pat. No. 4,580,092 to Squire is illustrative. Squire discloses a low-cost instrument specifically tailored for checking the quality of the match to an antenna system. In this connection, a single directional coupler samples the reflected energy and converts this sample to an led display that provides a rough overall indication of match quality. No linearizing circuitry or other means are taught to provide a calibrated and accurate indication of the actual reflection coefficient.

Nor does Squire permit broad band testing. To the contrary, the underlying principle upon which the Squire technology is predicated is one of defining a specific testing application, thereafter, selecting an appropriate, but relatively narrow bandwidth, oscillator. Finally, Squire does not address numerous of the testing regimes for which the present invention is particularly suited including, for example, amplifier and filter characteristics in which it is desired to measure and observe the forward transfer parameters in conjunction with, and while monitoring the reflection coefficients.

Other examples of reflection coefficient measuring apparatus includes U.S. Pat. Nos. 3,031,615 to Chase and 4,290,009 to Sanpei. None of these known references is seen as teaching or combining the present features which features include low cost and power consumption, low RF power operation, broad frequency capability, forward and reflected scalar scattering parameter measurement, with the capability that such measurements may be conducted simultaneously.

To achieve these features the present invention incorporates plural microwave oscillators, preferably of similar or identical but inexpensive design, which oscillators are mixed to produce a difference frequency covering the entire operating range of interest for the instrument. Use of similar oscillators achieves higher overall instrument stability through the mixing cancellation of ordinary environmentally induced instabilities common to both amplifiers. Inter-oscillator decoupling and post-mixing frequency counting combine to enhance instrument accuracy while further minimizing system instabilities.

Reflection coefficient measurements over a wide dynamic range are facilitated through employment of a dual-biased diode linearizer arrangement. More specifically, the linearizer combines feedback technology with an in-loop gain-switched buffer amplifier to achieve extended amplitude dynamic range with improved linearity over the full useful range.

Measurement of the forward transfer parameters of a device under test includes, in addition to above noted linearizer, a selectable attenuation/gain stage. This stage greatly diversifies the utility of the present analyzer by providing needed make-up gain for the out-of-band testing of filters and other high attenuation devices and, at the other extreme, attenuation for amplifiers and other gain devices.

More specifically the forward transfer attenuation/gain stage incorporates a plurality of PIN-diode switched attenuating or gain blocks, each block having a uniform number of switching diodes associated therewith such that any residual and uncompensated attenuation introduced by such diodes will be equal for each switch section and, between such sections, will be canceled.

Although PIN-diode switching is known, the present combination attenuator and gain arrangement must preferably cover the full operating range of the present instrument without range switching. In this connection, the disclosed attenuation/gain stage departs from known inductively decoupled diode biasing schemes in its use of resistive biasing networks and its application of dual biasing, the latter assuring that individual diodes do not remain in a latched, quasi-on state.

Other features, advantages and objectives of the present scalar network analyzer will be apparent from the Figures and Description of the Preferred Embodiment, below.

DESCRIPTION OF THE PREFERRED EMBODIMENT

Figure 1:
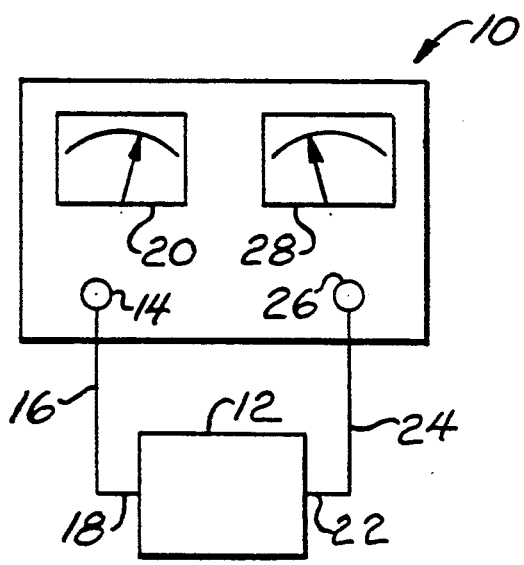
FIG. 1 is a pictorial representation of the present scalar network analyzer shown connected to a two-port device undergoing simultaneous forward and reflected parameter testing.

FIG. 1 illustrates the basic test configuration in which the scalar network analyzer 10 of the present invention is interconnected to a two-port device or system undergoing testing, shown at 12. As set forth in more detail hereinafter, the input reflection and forward transmission scalar coefficients or scattering parameters of device 12 may be determined from the test arrangement of FIG. 1. The device under test 12 may be either passive, for example a filter network, or active, for example an amplifier.

While the topology of the present network analyzer contemplates use over wide and various frequency ranges, a preferred arrangement as described herein covers the frequency range between 10 and 550 MHz. This range provides a reasonable tradeoff between product cost and the requirements of the commercial marketplace.

A pair of RF connectors are provided on the network analyzer to effect the required interface with the device under test. More specifically, a reflection output connector 14 interconnects through suitable RF cabling 16 to the input 18 of the device under test. A source of continuous wave (CW) radio frequency (RF) energy is generated within the analyzer 10, as detailed below, and supplied to output connector 14.

This RF energy defines the test signal for the device undergoing testing. Importantly, this RF signal is of a relatively low level, preferably about +8dbm or 6 milliwatts, thereby facilitating testing without the previously noted deleterious effects to personnel and equipment.

A meter or other display device 20 provides an indication of the scalar magnitude of the reflection coefficient as measured at the input 18 of the device 12 under test.

Similarly, the output 22 from the test device 12 is connected, through appropriate RF cabling 24 to the network analyzer transmission input connector 26. A second meter or other display device 28 provides an indication of the scalar magnitude of the forward transmission coefficient of the test device 12.

In an alternative test configuration, the present invention may be utilized to ascertain the input reflection coefficients of single-port, or quasi single-port devices, most notably by way of example, an antenna system.

Figure 2:
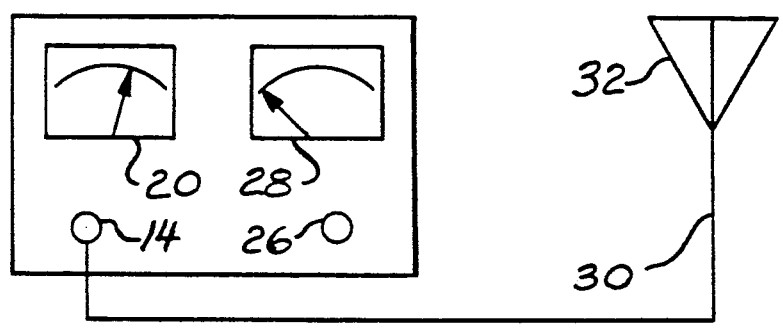
FIG. 2 is a pictorial representation of the present scalar network analyzer shown connected to one-port device undergoing reflected parameter testing.

FIG. 2 illustrates such a test arrangement in which the input or feed 30 of an antenna 32 is interconnected to the source of RF energy at reflection output connector 14. As before, meter 20 provides an indication of the reflected power coefficient (which coefficient is directly related to, and may therefore be calibrated as, the Voltage Standing Wave Ratio, or VSWR). No connection is required to the transmission connector 26 and, correspondingly, no indication will be observed on transmission coefficient meter 28.

It will be appreciated that other test configurations may be implemented using the flexible network analyzer system of the present invention. For example, an RF sampler, with or without pre-amplification, may be connected to transmission connector 26 thereby providing a convenient means for detecting and measuring the strength of RF fields.

Figure 3:
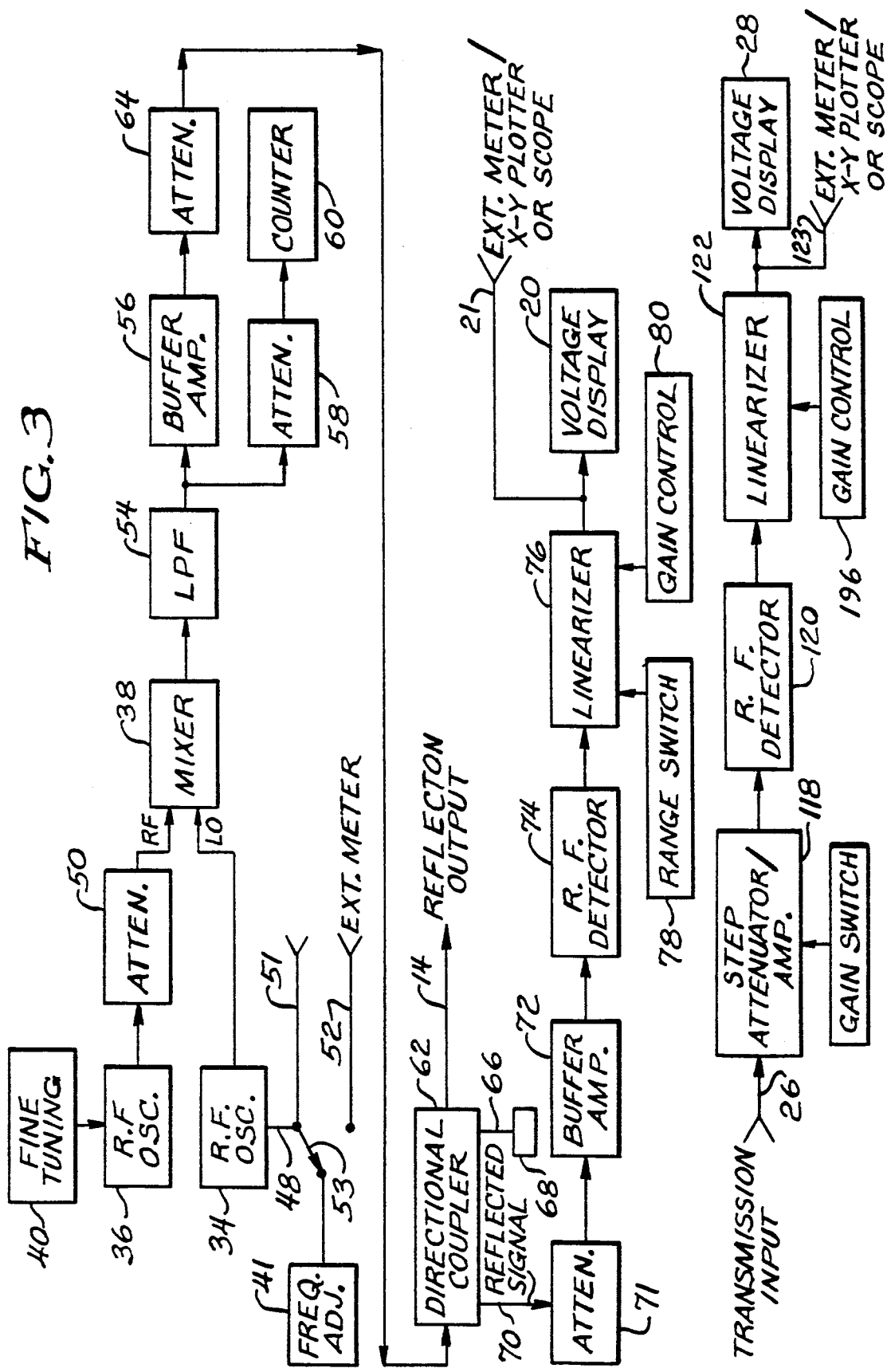
FIG. 3 is a block representation of the present scalar network analyzer.

Referring now to FIG. 3, a block representation is illustrated of the functional elements comprising the preferred arrangement of the present invention. As noted, the present analyzer advantageously embodies a wide fractional bandwidth, in the order of 60:1. Specifically, a frequency between 10 and 550 MHz is provided.

To achieve this frequency diversity, a pair of UHF (or microwave) oscillators 34 and 36 are mixed to generate a difference product which comprises the operating or test signal frequency outputted at connector 14.

Oscillators 34 and 36 are voltage controlled between the frequencies of about 900–1500 MHz. More specifically, oscillator 36 is initially adjusted, through a DC resistive divider arrangement shown at 40, to a frequency of 910 MHz. Divider 40 may advantageously include a panel adjustment for "fine tuning" the analyzer operating frequency. The frequency of oscillator 34, on the other hand, is broadly adjustable to effect tuning over the full frequency range of the instrument and is specifically set according to the requirements of the device 12 under test.

Figure 4:
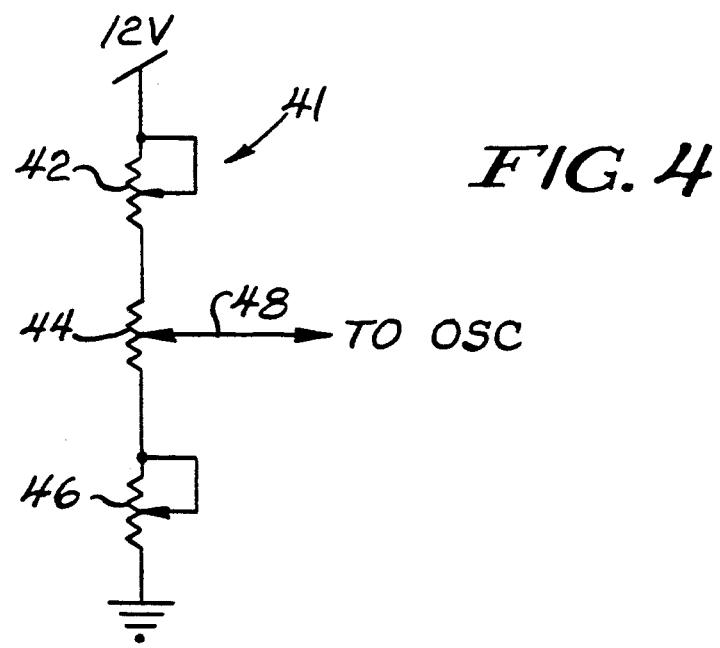
FIG. 4 is a schematic representation of the range limit setting and normal frequency adjustment arrangement of the present invention.

FIG. 4 illustrates the DC voltage control circuitry 41 utilized to establish the analyzer operating frequency as well as its upper and lower tuning limits. The three potentiometers 42, 44, and 46 define a voltage divider network having a DC output, which output is connected to the DC frequency control input 48 of oscillator 34.

The frequency of oscillator 34 is controlled between 920 MHz and 1460 MHz as a function of the setting of potentiometers 42,44,46. More specifically, potentiometers 42 and 46 set, respectively, the upper and lower frequency limits attained as the main frequency adjust potentiometer 44 is rotated through its full range.

Thus, when potentiometer 44 is rotated to its fully clockwise orientation (i.e. with the wiper at the potentiometer upper end), the frequency of oscillator 34 will be 1460 MHz. At the opposed counterclockwise end, the same oscillator frequency will be 920 MHz. The corresponding "difference" frequencies between oscillators 34 and 36 cover, in turn, the desired range of 10 through 550 MHz.

As noted, the present analyzer seeks to meet certain low power, low cost, and compact size and weight objectives. In furtherance of these objectives, inexpensive and compact UHF oscillators are employed. Advantageously, the present design permits use of relatively low cost oscillators 34,36 by reason that a relatively high overall system frequency stability can be maintained notwithstanding that the oscillators 34,36 are not, themselves, of great stability.

Preferably oscillators 34,36 should be of similar or identical design such that ordinary environmental variations, for example in supply voltage and ambient temperature, cause each oscillator to undergo similar frequency shift or drift characteristics. The absolute magnitude of such instabilities is not of paramount concern so long as both oscillators drift in comparative unison, that is, the same frequency drift, in the same direction. It will be appreciated that such movements, although large in absolute magnitude, are canceled by reason of the difference output frequency generated at mixer 38.

Oscillators 34,36 should preferably be operable from a single and common supply voltage to facilitate portable battery operation. Commercially available oscillators, for example the Z-Communications model V-500B, have been utilized with satisfactory results. In any event, the oscillators should preferably be operated in the output level range of about +17 dbm.

As noted, a difference operating frequency is generated by mixer 38. This mixer may be of the balanced diode mixer type. Such a configuration meets the cost, size, and power design parameters of the present analyzer. A Mini-Circuits model SAM-5 may be used in connection with the present analyzer for operations over the 10–550 MHz range.

System problems were encountered when interfacing the abovedescribed mixer and oscillators. More particularly, the interport isolation between the mixer 38 inputs was not found to be fully satisfactory when using the passive balanced diode mixer discussed above. As a consequence, oscillator interaction or 'frequency locking' was found when the oscillators were tuned to similar frequencies, that is, when the analyzer was operated at the lower end of its design operating range.

A solution to this 'locking' problem was found by the addition of a resistive attenuator 50 between oscillator 36 the RF input port to mixer 38. This attenuator is configured as a "pi" network thereby serving to isolate, impedance match and, additionally, lower the mixer RF input port signal to the appropriate level. Ten decibels (10db) attenuation has proven satisfactory.

An external connector 51 is provided to the frequency control input of oscillator 34. This output connection permits the metering of the control voltage or, alternatively, the interconnection of a chart recorder thereby permitting the generation of X-Y plots (verses frequency) of the reflection and/or transmission characteristics of a device under test.

A further external connector is provided at 52. This connector forms an alternate DC control voltage input to oscillator 34 and may be selectively enabled by double-throw switch 53. A sweep generator, connected at 52, may be used in the generation of automatic swept frequency response characteristics, for display on an oscilloscope, X-Y plotter or similar charting device.

The mixer 38 output contains, in addition to the desired difference frequency of 10–550 MHz, the conventional mixer products. A low pass filter 54, having a cutoff frequency in the order of 600 MHz, removes substantially all of the unwanted mixer products and provides a generally clean difference signal to the buffer amplifier 56 and the frequency counter 60 (through isolation attenuator 58). Low pass filter 54 is preferably of the passive variety and may be, for example, a Mini-Circuits model PLP-600.

Buffer amplifier 56 has a broad bandwidth, i.e. generally flat over the selected operating frequency range. Alternatively, the amplifier may implement a contoured frequency response representing the conjugate or complement response to that of the oscillators 34,36 and mixer 38. In this regard, the oscillator/mixer combination has been found to exhibit increased output as a function of increasing frequency and, therefore, a corresponding rolloff in the gain of amplifier 56 helps to meet the desired flat overall frequency response of ±2db. A Mini-Circuits model MAR-3 may be used for the preferred 10–550 MHz frequency range.

The second output from low pass filter 54 is routed to counter 60 through attenuator 58. This counter measures, and therefore is used to set, the actual operating frequency of the analyzer 10 thereby eliminating any requirement for the accurate adjustment and calibration of oscillators 34,36 frequency. Thus, as previously noted, oscillators 34,36 may be of a lesser expense design.

Attenuator 58, again of the "pi" configuration, serves to decouple the counter from the principal RF path by minimizing the deleterious impact of counter input impedance mismatch.

The output of the buffer amplifier 56 is, in turn, fed to a directional coupler 62 through 10db "pi" attenuator 64. This attenuator provides a proper source impedance to the directional coupler 62, typically 50 ohms, thereby minimizing reflections from buffer amplifier 56. Power passed from the output of the direction coupler 62 constitutes the RF test signal available at connector 14.

The forward power port 66 of directional coupler 62 is preferably internally terminated with a resistive load 68 of proper impedance. The output power at connector 14 remains relatively constant, at the +8dbm level, and therefore does not generally require leveling. As will become apparent hereinafter, the precise output level is not critical as variations in output level are automatically compensated during instrument calibration.

Alternatively, for more critical applications, the forward power port 66 may be fed to a signal detector and AGC circuit of conventional design (not shown) to provide output power leveling and adjustment.

The reflected power port 70, on the other hand, is available and is interconnected to the reflection coefficient measuring circuitry described hereinafter. The coupler, itself, is of the 10 db variety, that is, the energy coupled to the forward and reflected power ports is, respectively, 10 db below the corresponding forward and reflected power through the coupler. A commercially available direction coupler, for example a Mini-Circuits model MCL-10-5, provides sufficient directivity, flatness and matching over the 10–550 MHz operating range.

The coupled reflected power at 70 is passed through a 3 db attenuator 71 which, again, serves to match and isolate the directional coupler from the subsequent buffer amplifier 72. Amplifier 72 boosts the level of the coupled reflected signal and is required to achieve sufficient sensitivity for measuring well matched systems, i.e. those having return losses below −20 db or reflection coefficients less than 0.1. Amplifier 72 has a substantially flat gain profile over the requisite 10–550 MHz range. A Mini-Circuits MAR-1 amplifier has been utilized and found satisfactory.

The reflected power signal from amplifier 72 is, in turn, detected by RF detector 74 and linearizer 76 being thereafter fed to the internal meter 20 or external X-Y plotter or oscilloscope output connector 21.

Figure 5:
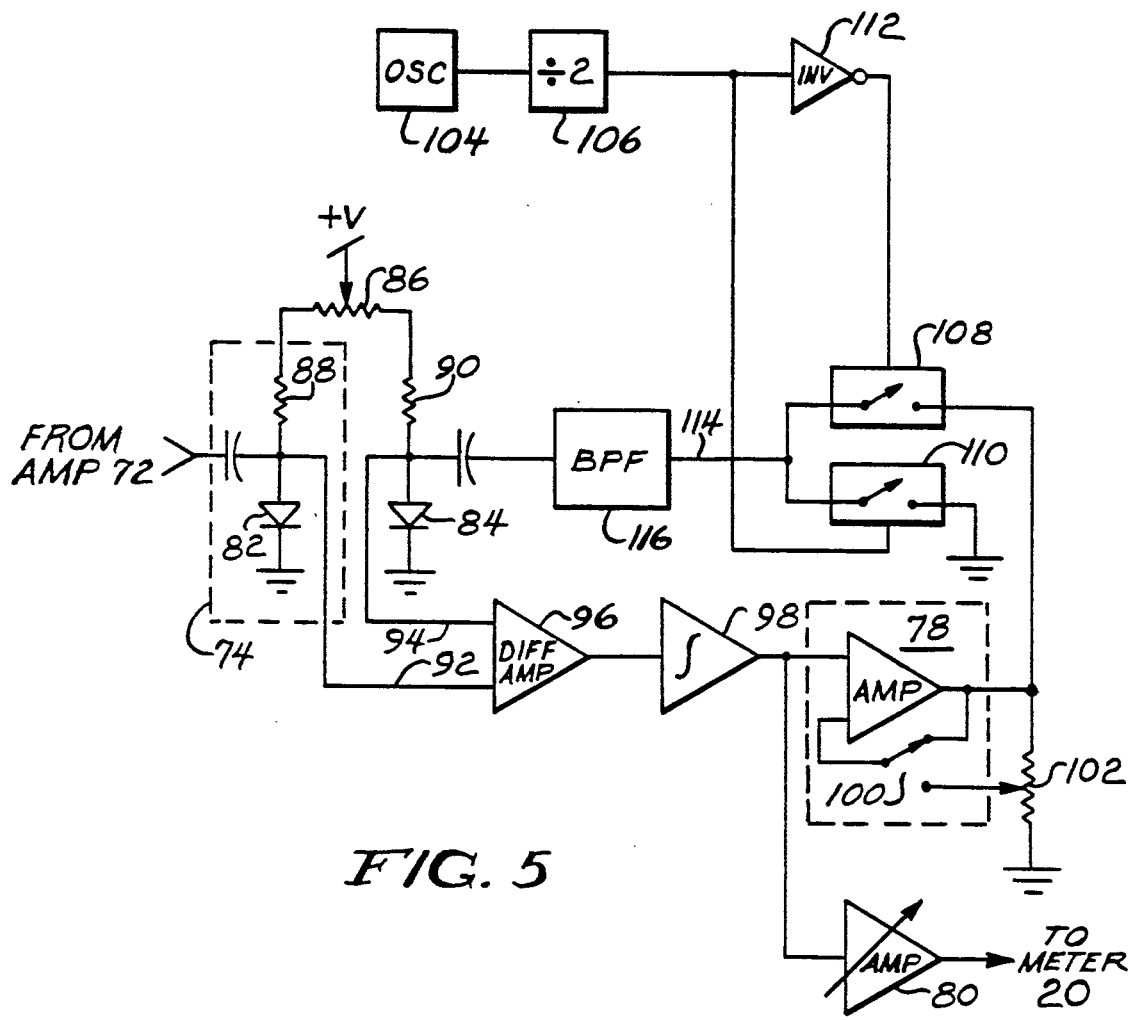
FIG. 5 is a block and schematic representation of the range-switched RF detector of the scalar network analyzer shown in FIG. 4.

FIG. 5 further illustrations the combined RF detector 74 and linearizer 76 circuitry of the present invention. As described in more detail hereinafter, linearizer 76 incorporates a novel sensitivity range switching arrangement 78 within a linearizing feedback loop thereby facilitating the dual functions of range selection and detector linearizing. Also provided is a controlled gain amplifier 80 required to drive the display meter 20 and to calibrate the analyzer for proper return loss or reflection coefficient measurements.

It is well-known that conventional unbiased diode RF detectors exhibit significant non-linearities and therefore relatively poor accuracy over varying signal level conditions. The present system employs a dual-biased diode arrangement in which the RF signal to be measured is detected by a first diode 82. As more fully detailed hereinafter, a lower frequency sinusoidal signal representative of the magnitude of the linearizer output is applied to the second diode 84, the difference in detected signal levels between these twin diodes forming the differential input signal to amplifier 96.

For best operation, diodes 82 and 84 are preferably matched. Each is biased to the threshold of conduction, typically about 10uA, through a resistive network comprising potentiometer 86 and series current limiting resistors 88 and 90. Potentiometer 86 is adjusted for a balanced condition as established by equal voltages at the respective inputs 92 and 94 of a differential amplifier 96. Use of biased diode detectors increases detector sensitivity while simultaneously minimizing non-linearities occasioned by diode operation at levels below diode cutoff.

Additional improvements in detector linearity are achieved by use of the feedback arrangement shown in FIG. 5 wherein the displayed output level, i.e. at meter 20, is a function of the difference voltage between the two diode detectors 82 and 84, not merely the product of the single detector 82 with its intrinsic non-linearity. In short, as the same diode non-linearity is experienced in each of the two signal input paths, such non-linearities cancel.

Referring again to FIG. 5, differential amplifier 96 is preferably of fixed gain, for example 20db, and may include a first order low pass function having a cut-off frequency in the range of 100–200 Hz. An integrator 98 having a corner frequency of approximately 15 Hz follows amplifier 96 thereby assuring a smoothed DC voltage output linearly corresponding to the level of the RF input from amplifier 72. This output drives meter 20 through an adjustable gain amplifier 80.

The integrator output additionally drives a range selectable buffer amplifier 78. A panel mounted switch 100 alternately configures buffer 78 as a unity-gain voltage follower or as a positive gain amplifier, the gain of which may be initially set by a potentiometer 102.

As noted, the present linearizer generates a fixed, generally low frequency, sinusoid (at diode 84) of a magnitude proportional to the DC voltage output of the linearizer. More accurately, the magnitude of this sinusoid is proportional to output of buffer 78, the gain of which may, as previously discussed, be selectively switched to effectively alter the sensitivity of measuring range of the instrument. More specifically, lowering the gain of buffer 78 (i.e. switching it to the unity gain mode), will result in a corresponding increase in the displayed reading of meter 20.

Generation of the low frequency sinusoid is achieved by chopping the DC output voltage from buffer 78 to form a square wave signal at the chopping frequency with a magnitude equal to the DC voltage being chopped. Thereafter, this square wave signal is passed through a bandpass filter centered around the chopping frequency thereby eliminating all but the fundamental sinusoid component.

The above described functions are performed by a 50 KHz oscillator 104 which, after a division by two at 106, gates a pair of analog bilateral switches, shown at 108, 110, at a 25 KHz rate. The frequency of gating is not critical and higher or lower frequencies may be selected. Use of divider 106 assures generation of a uniform 50% duty cycle square wave source to switches 108,110.

An invertor 112, in the gate input path to switch 108, results in the out-of-phase operation of switches 108 and 110, in turn, the switching the input 114 of band pass filter 116 alternately between the DC voltage from buffer 78 and ground.

A bandpass filter 116 of conventional design removes substantially all of the harmonic content from the square wave input signal thereby producing a sinusoid having a magnitude proportional to that of the incident square wave which, as noted, is proportional to the DC level from amplifier 78. In this manner, a sinusoid is impressed across, and detected by, the second diode 84, such sinusoid having an amplitude level directly proportional to the signal at meter 20 or, as discussed above, a range-scaled version of such signal.

As linearizer 76 is of the closed-loop feed-back variety, the amplitude of the internally-generated 25 KHz sinusoid (impressed across diode 84) tracks, i.e. will be of approximately the same magnitude as, the RF signal across diode 82 (excepting a small error voltage therebetween). Thus, as the magnitude of the RF signal from amplifier 72 increases, for example by doubling, there will be a corresponding doubling of the 25 KHz signal at diode 84, in turn, a doubling of the DC voltage to meter 20. In this manner the detected and displayed DC signal levels accurately represent the actual RF input signal level.

Referring again to FIG. 3, the forward transfer or transmission coefficient detector portion of the present analyzer includes a selectable pass stage 118 which drives an RF detector 120 and linearizer 122, in turn, a forward transmission meter 28. The forward RF detector and linearizer circuitry 120, 122 are substantially identical to the reflected RF detector and linearizer 74,76 discussed above except that the range switch 78 provided within the linearizer feedback loop is generally omitted.

Figure 6:
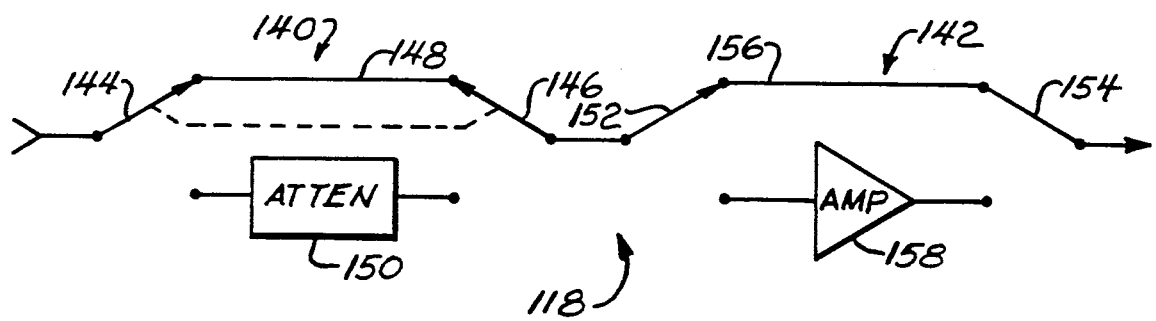
FIG. 6 is a block representation of the selectable attenuation/gain stage of the scalar network analyzer shown in FIG. 4.
Figure 7:
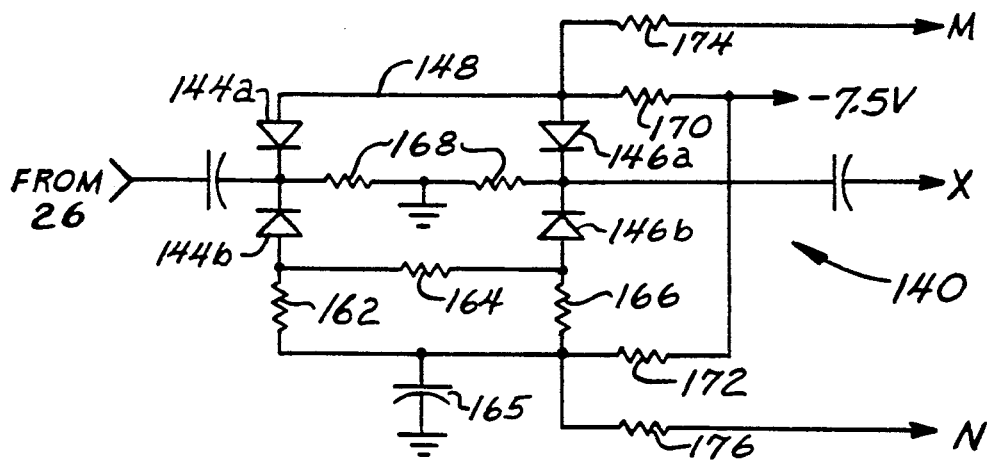
FIG. 7 is a schematic representation of a selectable attenuator section of the attenuation/gain stage of FIG. 6.
Figure 8:
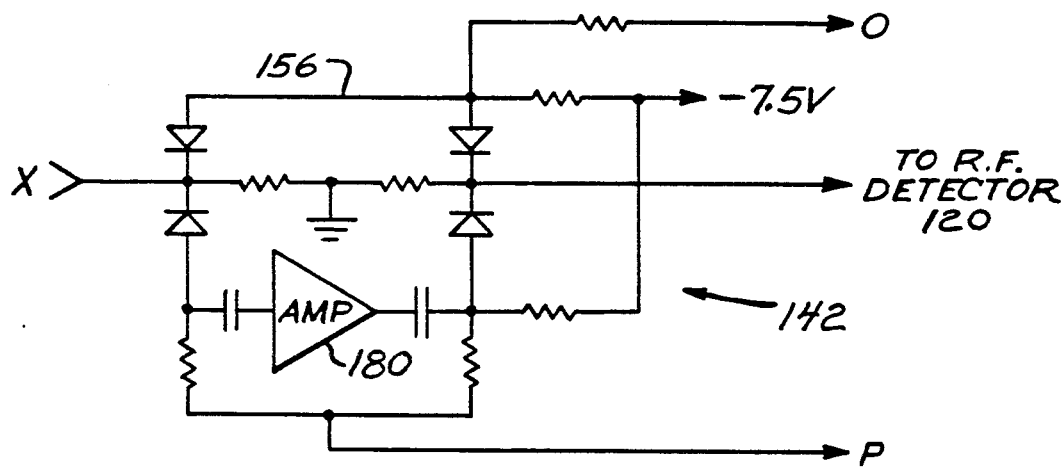
FIG. 8 is a schematic representation of a selectable gain section of the attenuator/gain stage of FIG. 6; and, FIG. 9 is a schematic representation of the gain/attenuation switching circuitry of the attenuator/gain stage of FIG. 6.

The selectable pass stage 118 is illustrated in FIGS. 6-8. It will be appreciated that the signal levels from the device 12 under test (FIG. 1), as connected to analyzer input connector 26, may vary over a substantially wider range of amplitudes than the reflected signals present at connector 14. The reflected signal levels present, for example at the directional coupler port 70, vary from a maximum value corresponding to a unity reflection coefficient to a minimum level generally about 30db below the maximum level - this minimum level being determined and limited by the directivity of the directional coupler 62.

By contrast, the signal levels present at the forward transfer connector 26 may greatly exceed the "unity" level (i.e. the output test signal level from connector 14) by reason that the test device 12 may, itself, having gain, e.g. an amplifier. In addition, signal levels below the −30db level may, not only be present at the forward connector 26, but may provide useful information about system performance. Unlike the above-described arrangement for measuring device reflection coefficients, there is no directional coupler associated with the forward coefficient measurement and, consequently, the directivity-limited sensitivity floor, inherent whenever a directional coupler is employed, is not a factor.

For all of these reasons, the pass stage 118 preferably comprises plural elements of attenuation and/or gain. Attenuation would be appropriate where the device 12 under test exhibits gain thereby to reduce the overall signal level to detector/linearizer 120,122 to within a predetermined range, for example −5 to +15dbm.

At the other end of the signal level spectrum, that is where the device under test imparts substantial attenuation, pass stage 118 is set to provide gain, again, to bring the signal level to the detector/linearizer within the above noted range.

Finally, there is the middle ground for those devices 12 having neither high gain nor excessive attenuation. For such test devices, pass stage 118 may be set to exhibit neither gain nor attenuation. It will of course be understood that any given device undergoing testing may (as a function of test frequency or device adjustment) transition from one of these categories to another. Pass stage 118, with its panel selectable gain/attenuation control, expeditiously accommodates these potentially frequent and instantaneous shifts.

FIG. 6 illustrates, in block form, a preferred arrangement of the present pass stage 118 having cascaded first unity/attenuation and second unity/gain stages 140 and 142, respectively. As described in more detail hereinafter, each of these stages includes two-position electronic switches to select between two alternate pass/gain/attenuation paths. It will be appreciated that other configurations of the pass stage 118 are contemplated herein including, for example, the cascading of additional stages or the inclusion of additional switch positions for each of the existing stages.

With continuing reference to FIG. 6, the unity/attenuation stage 140 includes a two position switch having ganged first and second poles 144 and 146. Switches 144,146 selectively engage either the unity gain path 148 or the attenuator 150. Attenuator 150 may be of any attenuation although, in view of the fact that the dynamic range of the detector/linearizer is approximately 20db, a 20db attenuator is preferred. In this manner the maximum input signal range can be achieved while simultaneously assuring that the signal to the detector/linearizer can be brought within the required range.

The second or unity/gain stage 142 uses a second two position switch comprising ganged poles 152 and 154. In like manner, this switch selectively engages either a unity gain path 156 or a amplifier gain stage 158. Again, any reasonable gain may be chosen for amplifier 158, although 20db is preferable as set forth above.

FIGS. 7 and 8 illustrate in more detail the implementation of the attenuator and gain stages 140 and 142 (of FIG. 6), respectively. The signal from the forward connector 26 inputs attenuator stage 140 (shown at the left, FIG. 7), in turn, to gain stage 142 at "X" (FIGS. 7 and 8), then, to the RF detector 120.

As illustrated in FIG. 7, four PIN diodes, along with associated biasing and switching resistors, define the double-pole, double-throw switch 144,146 of FIG. 6. These diodes are designated, as per FIG. 6, with the two diodes forming the input pole 144 shown as 144a,b and the corresponding output pole diodes shown as 146a,b.

As set forth below, either the "a" or "b" diodes are biased, as a pair, into conduction (i.e. "on") while the remaining diode pair is back-biased to assure their continued "off" condition. Biasing the "a" diode pair "on" completes the unity gain path 148 from the input at 26 to the output at "X". Alternatively, switching the "b" diode pair "on" results in the insertion of a "pi" section attenuator, comprising resistors 162, 164, and 166, in the path between input and output connections 26,X. These resistors are selected in the conventional manner to provide the desired attenuation (20db) at an appropriate impedance, typically 50 ohms. In the present case, resistors 162 and 166 are 62 ohms while resistor 164 is 240 ohms. Capacitor 165 serves to RF ground the attenuator while facilitating the DC switching biasing described below.

The forward and reverse biasing of diodes 144a,b and 146a,b is advantageously achieved as set forth hereinafter without resort the use of inductor which often exhibit resonances when operated over the broad bandwidth contemplated by the present invention.

The cathode of each diode is provided a DC path to ground through resistors 168, typically above k ohm, each, for a 50 ohm RF impedance system. Resistors 170,172 provide a DC path from, respectively, the "a" and "b" diodes to a negative potential DC source. These resistors are of relatively high value, typically k ohm, and serve to assure that each of the diodes is held in the "off" condition unless specifically and otherwise biased "on". It will be observed that biasing path to the anode of diode 144b, for both negative and positive biasing, includes the three attenuator resistors 162,164,166. As these resistors are of relatively low resistance, they exhibit negligible influence on the DC biasing of diode 144b.

Resistors 174 and 176 define the forward or "on" biasing paths, respectively, for the "a" and "b" diodes. These positive biasing resistances are substantially lower than the corresponding negative bias resistors 174,176 (e.g. typically about 750 ohms) and, therefore, easily cause the forward biasing of the respective diodes when connected to positive DC voltage source. A panel gain/attenuator switch 182 (FIG. 9) is provided to allow the user to selectively engage the "unity gain" and "attenuator" modes of stage 140, as well as the several modes of the gain stage 142 (FIG. 8) discussed hereinafter.

An important feature of the unity/attenuator stage 40 is its use of balanced diode switching pairs in each of its selectable paths. There are, in short, two diodes associated with each path and, consequently, any residual loss caused by the diodes will be present regardless of the mode selected. Thus, while the absolute attenuation of stage 140 may be somewhat greater than the theoretical requisite and 20db, it will be appreciated that the ratio, or the additional attenuation, between the two paths will, in any event, remain 20db.

FIG. 8 illustrates in more detail the unity/gain stage 142 of FIG. 6. FIG. 8 operates substantially as described above in connection with the attenuation stage 140 of FIG. 7 except that an amplifier 180 is substituted for the "pi" attenuator of FIG. 7.

Figure 9:
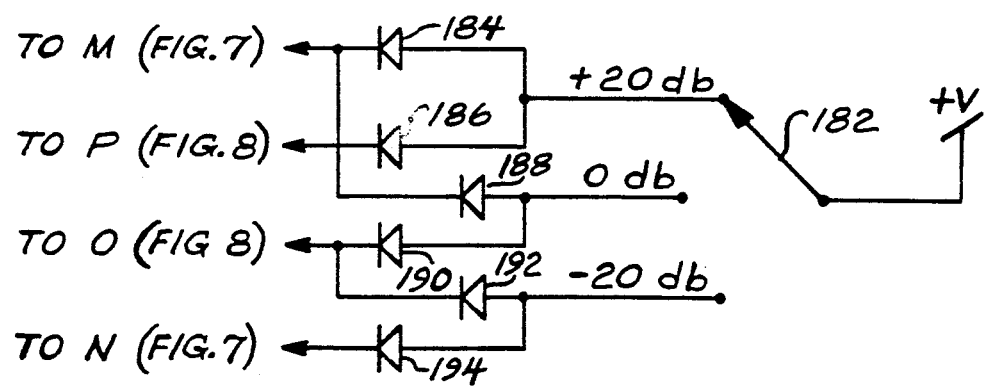

FIG. 9 depicts the panel mounted attenuation/gain switching arrangement used to select between the various modes of the attenuation/gain stages 140,142. Specifically, a plurality of diodes 184-194 are "wired-or'd" and selected in pairs by switch 182 to selectively achieve stage 118 through-put gains of, respectively, −20db, 0db, and +20db. Zero gain/attenuation occurs by simultaneously enabling the unity gain paths of 148 and 156 of respective stages 140 and 142. Diodes 188 and 190 enable these paths by applying the requisite positive voltage at points "M" and "O" (FIGS. 7 and 8). In similar fashion the attenuation and gain functions are selected by enabling the attenuator and gain stages at "N" and "P", respectively, while maintaining the appropriate remaining stage in its unity gain configuration.

In operation a device 12 under test is connected as shown either in FIGS. 1 or 2. However, prior to actual testing, the present network analyzer is preferably calibrated. Reflection coefficient calibration is best performed by placing a shortcircuit connection across connector 14, thereafter, adjusting amplifier 89 gain until a full deflection is observed on meter 20.

Calibration for forward transfer characteristics is preferably performed by placing a jumper cable between connectors 14 and 26 and adjusting the forward linearizer amplifier gain 196 and attenuator/gain stage 118 switch 182, as required, for a full-scale deflection of meter 28. In this manner, absolute forward gain/attenuation measurements may be performed.

Alternatively, forward transfer calibration may be performed by substituting that actual device to be tested in place of the jumper, that is, by placing the device under test between connectors 14 and 26 as shown in FIG. 1. A calibration frequency is selected (generally at the center of a filter passband or the point of maximum amplifier gain) and appropriate gain and range adjustments made to set meter 28 to full-scale. In this manner, gain or attenuation characteristics can be measured at various frequencies and compared to the gain/attenuation of the device 12 at the test frequency thereby producing relative gain/attenuation figures.

Actual device 12 testing is thereafter accomplished by adjusting potentiometer 44 until the desired test frequency is displayed by counter 60. The magnitude of the scalar reflection and transmission coefficients may be directly read from meters 20 and 28. The reflection range switch 100 and transmission gain/attenuation switch 182 may be adjusted as necessary to maintain respective meter indications on-scale and at acceptable levels.

It will be appreciated that during testing, the frequency may advantageously be readjusted as necessary to form a complete understanding of device operation or, alternatively, a voltage ramp generator/sweep oscillator may be connected at 51 to facilitate automatic swept frequency response characteristics. Further, an X-Y plotter may be connected (X-axis at connector 51 and Y-axis, as desired, at connectors 21 or 123) to provide reflected and forward transfer characteristic plots as a function of frequency.

What is claimed:

1. Portable self-contained apparatus for measuring the magnitude of the reflection or forward transmission coefficients of a device under test at one or more frequencies over a predetermined wide range of test frequencies including first and second connections for operatively interconnecting the apparatus to the device under test; a low power frequency generator, said frequency generator having means for selectively setting the frequency thereof within said wide frequency range; a directional coupler operatively connected to the frequency generator and to said first test device connection, the directional coupler having a reflected power port, the power at the reflected power port being proportional to the reflection coefficient of the device under test; detector means operatively connected to the directional coupler reflected power port for producing a DC voltage representative of the reflected power at the first connection, the detector means including linearizing means whereby the magnitude of the detected DC voltage is generally proportional to the reflection coefficient, the linearizer means further including means for selecting the reflection coefficient sensitivity range; forward transmission coefficient measuring means including gain means operatively connected to the second test device connection and to a detector means for selectively attenuating, amplifying, and passing the signal from the test device at the second connection whereby the signal level at the forward detector may be maintained within a predetermined range; the forward detector means including linearizing means whereby the magnitude of the DC voltage from the detector is generally proportional to the forward transmission coefficient; the low power frequency generator includes first and second continuouswave oscillators and mixer means operatively connected to the oscillators for obtaining the difference product therebetween, said difference product defining a continuous-wave test frequency within said wide frequency range; the first and second oscillators being of substantially similar design and construction and being retained within the self-contained apparatus whereby both oscillators are subjected to substantially similar environmental conditions thereby causing each oscillator to experience similar environmentally induced frequency instability characteristics, such instabilities being canceled in the difference product of the mixer means thereby improving the stability of the test frequency.

2. The portable self-contained forward transfer and reflection coefficient measuring apparatus of claim 1 including means for decoupling the first and second oscillators thereby minimizing test frequency instability caused by oscillator frequency locking.

3. Portable self-contained apparatus for measuring the magnitude of the reflection or forward transmission coefficients of a device under test at one or more frequencies over a predetermined wide range of test frequencies including first and second connections for operatively interconnecting the apparatus to the device under test; a low power frequency generator, said frequency generator having means for selectively setting the frequency thereof within said wide frequency range; a directional coupler operatively connected to the frequency generator and to said first test device connection, the directional coupler having a reflected power port, the power at the reflected power port being proportional to the reflection coefficient of the device under test; detector means operatively connected to the directional coupler reflected power port for producing a DC voltage representative of the reflected power at the first connection, the detector means including linearizing means whereby the magnitude of the detected DC voltage is generally proportional to the reflection coefficient, the linearizer means further including means for selecting the reflection coefficient sensitivity range; forward transmission coefficient measuring means including gain means operatively connected to the second test device connection and to a detector means for selectively attenuating, amplifying, and passing the signal from the test device at the second connection whereby the signal level at the forward detector may be maintained within a predetermined range; the forward detector means including linearizing means whereby the magnitude of the DC voltage from the detector is generally proportional to the forward transmission coefficient; the detector and linearizing means operatively connected to the reflected power port includes a dual biased diode feedback detector, said detector having at least one gain switchable stage within the feedback loop whereby the DC level of the detector and linearizer output may be range switched as required to increase detection sensitivity and to accurately perform measurement over a wide range of reflection coefficients.

4. Portable self-contained apparatus for measuring the magnitude of the reflection or forward transmission coefficients of a device under test at one or more frequencies over a predetermined wide range of test frequencies including first and second connections for operatively interconnecting the apparatus to the device under test; a low power frequency generator, said frequency generator having means for selectively setting the frequency thereof within said wide frequency range; a directional coupler operatively connected to the frequency generator and to said first test device connection, the directional coupler having a reflected power port, the power at the reflected power port being proportional to the reflection coefficient of the device under test; detector means operatively connected to the directional coupler reflected power port for producing a DC voltage representative of the reflected power at the first connection, the detector means including linearizing means whereby the magnitude of the detected DC voltage is generally proportional to the reflection coefficient, the linearizer means further including means for selecting the reflection coefficient sensitivity range; forward transmission coefficient measuring means including gain means operatively connected to the second test device connection and to a detector means for selectively attenuating, amplifying, and passing the signal from the test device at the second connection whereby the signal level at the forward detector may be maintained within a predetermined range; the forward detector means including linearizing means whereby the magnitude of the DC voltage from the detector is generally proportional to the forward transmission coefficient; the forward transfer coefficient gain means includes at least one stage having two or more independently selectable signal paths, switch means operatively connected to the stage for selectively enabling at least one of said paths; each path defining a predetermined gain, attenuation, or pass characteristic whereby the overall gain or attenuation of the gain means may be selectively adjusted to maintain the signal to the forward transfer coefficient detector means within a predetermined range.

5. Portable self-contained apparatus for measuring the magnitude of the reflection or forward transmission coefficients of a device under test at one or more frequencies over a predetermined wide range of test frequencies including first and second connections for operatively interconnecting the apparatus to the device under test; a low power frequency generator, said frequency generator having means for selectively setting the frequency thereof within said wide frequency range; a directional coupler operatively connected to the frequency generator and to said first test device connection, the directional coupler having a reflected power port, the power at the reflected power port being proportional to the reflection coefficient of the device under test; detector means operatively connected to the directional coupler reflected power port for producing a DC voltage representative of the reflected power at the first connection, the detector means including linearizing means whereby the magnitude of the detected DC voltage is generally proportional to the reflection coefficient, the linearizer means further including means for selecting the reflection coefficient sensitivity range; forward transmission coefficient measuring means including gain means operatively connected to the second test device connection and to a detector means for selectively attenuating, amplifying, and passing the signal from the test device at the second connection whereby the signal level at the forward detector may be maintained within a predetermined range; the forward detector means including linearizing means whereby the magnitude of the DC voltage from the detector is generally proportional to the forward transmission coefficient; the forward transfer coefficient gain means includes at least one stage having two or more independently selectable signal paths, switch means operatively connected to the stage for selectively enabling at least one of said paths; each path defining a predetermined gain, attenuation, or pass characteristic whereby the overall gain or attenuation of the gain means may be selectively adjusted to maintain the signal to the forward transfer coefficient detector means within a predetermined range; the switch means includes a plurality of diodes; first DC biasing means for maintaining the diodes in an open signal blocking condition; and second DC biasing means for maintaining the diodes in a closed signal passing condition; the biasing level of the second biasing means being greater than, and overriding, the level of the first biasing means whereby the diodes are switched by selectively enabling the second biasing means without disabling the first biasing means.

6. Portable self-contained apparatus for measuring the magnitude of the reflection or forward transmission coefficients of a device under test at one or more frequencies over a predetermined wide range of test frequencies including first and second connections for operatively interconnecting the apparatus to the device under test; a low power frequency generator, said frequency generator having means for selectively setting the frequency thereof within said wide frequency range; a directional coupler operatively connected to the frequency generator and to said first test device connection, the directional coupler having a reflected power port, the power at the reflected power port being proportional to the reflection coefficient of the device under test; detector means operatively connected to the directional coupler reflected power port for producing a DC voltage representative of the reflected power at the first connection, the detector means including linearizing means whereby the magnitude of the detected DC voltage is generally proportional to the reflection coefficient, the linearizer means further including means for selecting the reflection coefficient sensitivity range; forward transmission coefficient measuring means including gain means operatively connected to the second test device connection and to a detector means for selectively attenuating, amplifying, and passing the signal from the test device at the second connection whereby the signal level at the forward detector may be maintained within a predetermined range; the forward detector means including linearizing means whereby the magnitude of the DC voltage from the detector is generally proportional to the forward transmission coefficient; the forward transfer coefficient gain means includes at least one stage having two or more independently selectable signal paths, switch means operatively connected to the stage for selectively enabling at least one of said paths; each path defining a predetermined gain, attenuation, or pass characteristic whereby the overall gain or attenuation of the gain means may be selectively adjusted to maintain the signal to the forward transfer coefficient detector means within a predetermined range; the switch means includes a plurality of diodes and selectable biasing means for maintaining the diodes in one of a first open signal blocking condition or in a second closed signal passing condition; said biasing means including non-inductive means for limiting the current and for RF decoupling and isolating the switch means whereby proper operation and decoupling of the switch means may be maintained over the entire predetermined wide frequency range.

* * * * *